(12) United States Patent
Nagamatsu et al.

(10) Patent No.: US 9,887,323 B2
(45) Date of Patent: Feb. 6, 2018

(54) LIGHT-EMITTING ELEMENT

(71) Applicant: TOYODA GOSEI CO., LTD., Kiyosu-shi (JP)

(72) Inventors: Yuichi Nagamatsu, Chiba (JP); Hironao Shinohara, Chiba (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 17 days.

(21) Appl. No.: 14/723,322

(22) Filed: May 27, 2015

(65) Prior Publication Data

US 2015/0349209 A1 Dec. 3, 2015

(30) Foreign Application Priority Data

May 27, 2014 (JP) .................................. 2014-108996

(51) Int. Cl.
| *H01L 33/40* | (2010.01) |
| *H01L 33/14* | (2010.01) |
| *H01S 5/042* | (2006.01) |
| *H01L 33/42* | (2010.01) |
| *H01L 33/44* | (2010.01) |
| *H01L 33/48* | (2010.01) |

(52) U.S. Cl.
CPC ............ *H01L 33/405* (2013.01); *H01L 33/42* (2013.01); *H01L 33/44* (2013.01); *H01L 33/486* (2013.01)

(58) Field of Classification Search
CPC ..................................................... H01L 33/38
See application file for complete search history.

(56) References Cited

U.S. PATENT DOCUMENTS

| 2012/0098009 A1* | 4/2012 | Kim et al. | ............... H01L 33/38 257/98 |
| 2013/0181244 A1* | 7/2013 | Sato | ....................... H01L 33/405 257/98 |
| 2013/0234192 A1* | 9/2013 | Kim | ..................... H01L 33/0008 257/98 |
| 2015/0287887 A1 | 10/2015 | Sato et al. | |
| 2016/0118544 A1 | 4/2016 | Sato et al. | |

FOREIGN PATENT DOCUMENTS

| JP | 2008-192690 A | 8/2008 |
| JP | 2011-210847 A | 10/2011 |
| JP | 2013-165252 A | 8/2013 |

OTHER PUBLICATIONS

Japanese Office Action dated Mar. 7, 2017 with a partial English translation.

* cited by examiner

*Primary Examiner* — Su C Kim
*Assistant Examiner* — David S Wilbert
(74) *Attorney, Agent, or Firm* — McGinn IP Law Group, PLLC

(57) ABSTRACT

A light-emitting element includes a semiconductor laminate including a light-emitting layer, a transparent electrode layer formed on the semiconductor laminate, the transparent electrode layer including an oxide including indium, a pad electrode formed on the transparent electrode layer so as to connect to the transparent electrode layer, and a reflective layer including aluminum. The reflective layer is formed under the pad electrode so as not to contact the transparent electrode layer.

26 Claims, 2 Drawing Sheets

1 LIGHT-EMITTING ELEMENT
14 TRANSPARENT ELECTRODE LAYER
15 PAD ELECTRODE
16 REFLECTIVE LAYER
17 CURRENT BLOCKING LAYER

LIGHT-EMITTING ELEMENT

The present application is based on Japanese patent application No. 2014-108996 filed on May 27, 2014, the entire contents of which are incorporated herein by reference.

BACKGROUND OF THE INVENTION

1. Field of the Invention

The invention relates to a light-emitting element.

2. Description of the Related Art

A light-emitting element is known which has a low-refractive index layer under a p-side pad electrode and a transparent electrode on a semiconductor laminate (see, e.g., JP-A-2008-192690). The low-refractive index layer reflects light to travel toward the p-side pad electrode so as to reduce light absorption at the p-side pad electrode. Meanwhile, the transparent electrode allows a current flowing from the p-side pad electrode to be diffused over the entire semiconductor laminate.

Also a light-emitting element is known which has a current-blocking portion under a p-side pad electrode (see, e.g., JP-A-2011-210847). The current-blocking portion is a member of an insulating material and functions to block a current to a portion directly below the p-side pad electrode so as to reduce a light emission rate from a portion of a light-emitting layer located directly below the p-side pad electrode, thereby reducing light absorption at the p-side pad electrode.

SUMMARY OF THE INVENTION

The light-emitting element disclosed in JP-A-2008-192690 is constructed such that the transparent electrode is formed to cover the low-refractive index layer. Therefore, if the low-refractive index layer is formed of an Al-containing material such as $Al_2O_3$ and the transparent electrode is formed of an In-containing oxide such as IZO (In-doped ZnO), the In-containing oxide in the transparent electrode can be reduced by Al in the low-refractive index layer such that the metal indium precipitates on the surface of the transparent electrode. Since the metal indium is opaque, a portion of the transparent electrode may be opaque.

It is an object of the invention to provide a light-emitting element that prevents a transparent electrode from becoming opaque even if it includes an Al-containing reflective layer and the transparent electrode formed of an In-containing oxide under a pad electrode.
(1) According to one embodiment of the invention, a light-emitting element comprises:
a semiconductor laminate comprising a light-emitting layer;
a transparent electrode layer formed on the semiconductor laminate, the transparent electrode layer comprising an oxide including indium;
a pad electrode formed on the transparent electrode layer so as to connect to the transparent electrode layer; and
a reflective layer including aluminum,
wherein the reflective layer is formed under the pad electrode so as not to contact the transparent electrode layer.
In the above embodiment (1) of the invention, the following modifications and changes can be made.
(i) The light-emitting element further comprises an insulating current blocking layer formed between the reflective layer and the semiconductor laminate so as to block a current to the semiconductor laminate in a region directly below the pad electrode.
(ii) The reflective layer is formed inside a hole formed on the transparent electrode layer.
(iii) The reflective layer comprises an Al film.
(iv) The transparent electrode layer comprises one of IZO, In2O3, ITO and IFO.

Effects of the Invention

According to one embodiment of the invention, a light-emitting element can be provided that prevents the transparent electrode from becoming opaque even if it includes an Al-containing reflective layer and the transparent electrode formed of an In-containing oxide under a pad electrode.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

Figure 1:
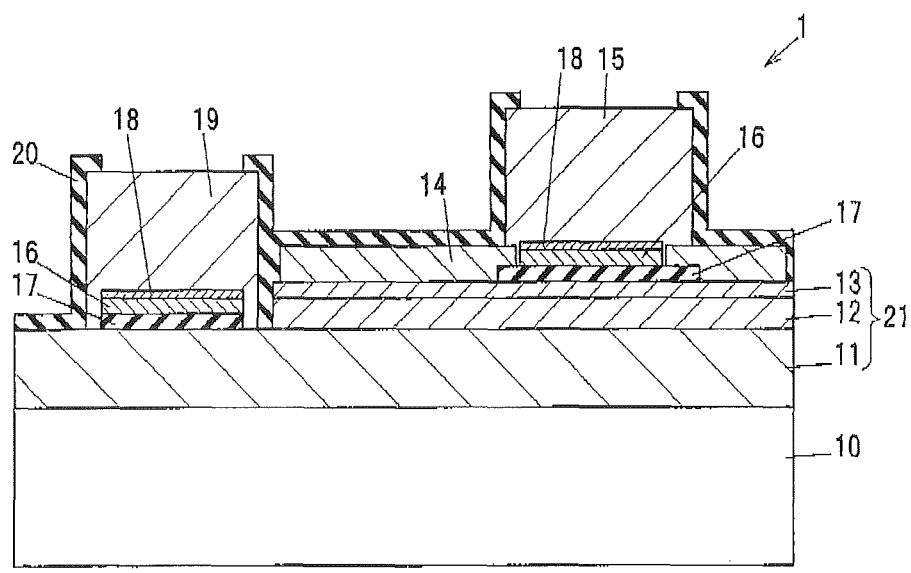
FIG. 1 is a vertical cross-sectional view showing a light-emitting element in an embodiment.
Figure 2A:
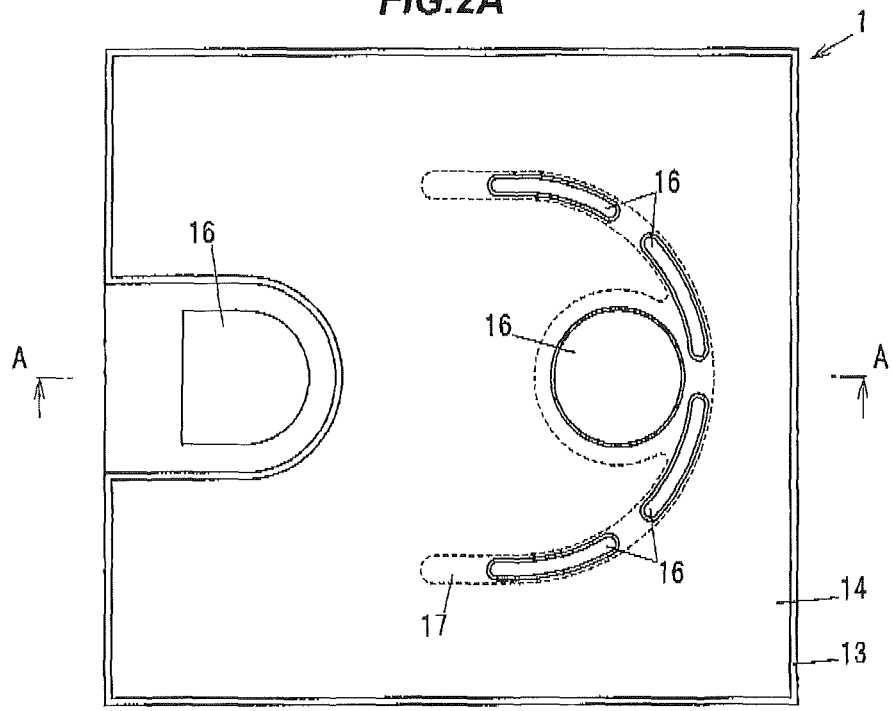
FIGS. 2A and 2B are top views showing the light-emitting element in the embodiment.
Figure 2B:
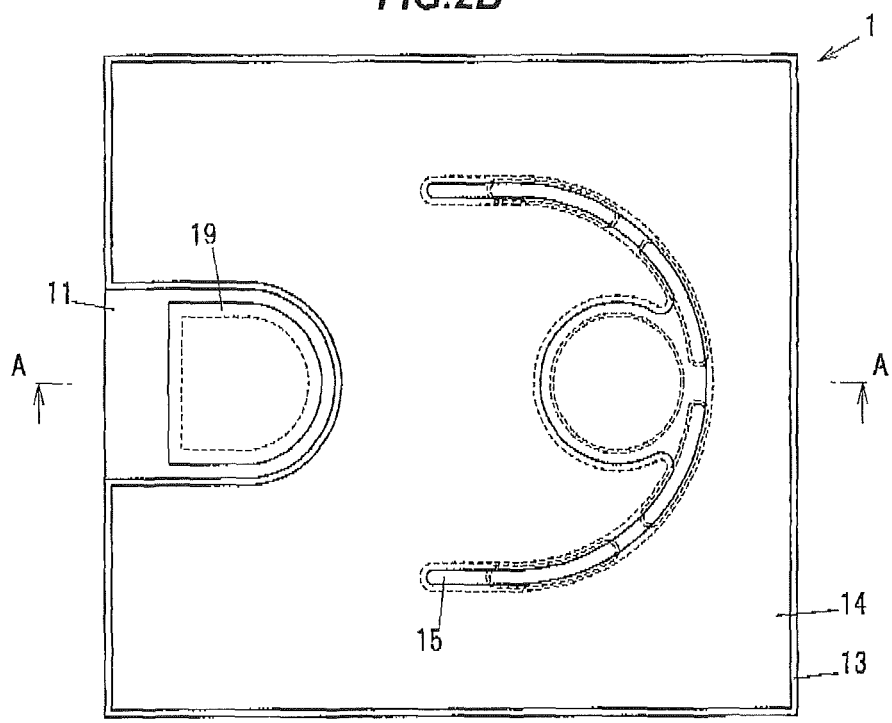

Configuration of Light-Emitting Element
FIG. 1 is a vertical cross-sectional view showing a light-emitting element 1 in the embodiment. FIGS. 2A and 2B are top views showing the light-emitting element 1. FIG. 1 shows a cross section when the light-emitting element 1 is cut along line A-A in FIGS. 2A and 2B.
FIG. 2A is a top view before forming pad electrodes 15 and 19 which are described later. FIG. 2B is a top view after forming the pad electrodes 15 and 19. In FIG. 2A, the illustration of a barrier layer 18 (described later) is omitted.
The light-emitting element 1 has a substrate 10, a semiconductor laminate 21 on the substrate 10, a transparent electrode layer 14 on the semiconductor laminate 21, a pad electrode 15 formed on the transparent electrode layer 14 so as to be connected to the transparent electrode layer 14, and a pad electrode 19 formed on an n-type semiconductor layer 11 so as to be connected to the n-type semiconductor layer 11.
The light-emitting element 1 is, e.g., an LED or a laser diode, etc. The light-emitting element 1 may be either a face-up type element or a face-down type element.
The substrate 10 is, e.g., a sapphire substrate.
The semiconductor-laminate 21 includes the n-type semiconductor layer 11, a light-emitting layer 12 on the n-type semiconductor layer 11, and a p-type semiconductor layer 13 on the light-emitting layer 12.
Each of the n-type semiconductor layer 11, the light-emitting layer 12 and the p-type semiconductor layer 13 is formed of, e.g., a group-III nitride compound semiconductor. The group-III nitride compound semiconductor is, e.g., a quaternary group-III nitride compound semiconductor represented by $Al_xGa_yIn_{1-x-y}N$ ($0 \leq x \leq 1$, $0 \leq y \leq 1$, $0 \leq x+y \leq 1$).
The n-type semiconductor layer 11 has a laminated structure composed of, e.g., an n-type contact layer, and n-type ESD layer and an n-type cladding layer each of which contains an n-type dopant such as Si.

The light-emitting layer 12 has a multiple quantum well structure including, e.g., plural well layers and plural barrier layers. The well layers are formed of, e.g., InGaN and the barrier layers are formed of, e.g., GaN, InGaN or AlGaN.

The p-type semiconductor layer 13 has a laminated structure composed of, e.g., a p-type cladding layer and a p-type contact layer each of which contains a p-type dopant such as Mg.

The n-type semiconductor layer 11, the light-emitting layer 12 and the p-type semiconductor layer 13 are formed by epitaxially growing a crystal on the substrate 10 using, e.g., a metal organic chemical vapor deposition (MOCVD) method, a molecular beam epitaxy (MBE) method or a halide vapor phase epitaxy (HVPE) method. The positions of the n-type semiconductor layer 11 and the p-type semiconductor layer 13 may be reversed.

The transparent electrode layer 14 is a transparent layer formed of an oxide containing indium, e.g., IZO (In-doped ZnO), $In_2O_3$, ITO (Sn-doped $In_2O_3$) or IFO (F-doped $In_2O_3$) and allows the current flowing from the pad electrode 15 to be evenly diffused in the p-type semiconductor layer 13. The transparent electrode layer 14 is formed by, e.g., a vacuum deposition method, a sputtering method, a CVD method or a sol-gel method.

The pad electrodes 15 and 19 are to be connected to bonding wires, etc., and have, e.g., a Ta/Pt/Au laminated structure. Light is emitted from the light-emitting layer 12 when a voltage is applied between the n-type semiconductor layer 11 and the p-type semiconductor layer 13 through the pad electrodes 15 and 19. The pad electrodes 15 and 19 can be formed by a sputtering method, etc.

A reflective layer 16 containing Al is formed under the pad electrodes 15 and 19. Since the light emitted from the light-emitting layer 12 and traveling toward the pad electrodes 15 and 19 is reflected by the reflective layer 16, light absorption by the pad electrodes 15 and 19 is reduced. The reflective layer 16 can be formed by a sputtering method, etc.

The reflective layer 16 is, e.g., a metal film containing Al such as an Al film.

The reflective layer 16 located between the pad electrode 15 and the semiconductor laminate 21 is not in contact with the transparent electrode layer 14. If the transparent electrode layer 14 is in contact with the reflective layer 16, the indium-containing oxide constituting the transparent electrode layer 14 is reduced by Al contained in the reflective layer 16 and then causes precipitation of metal indium on the surface of the transparent electrode layer 14. Since the metal indium is opaque, a portion of the transparent electrode layer 14 becomes opaque and the opaque portion causes a decrease in light emission from the light-emitting element 1.

The reflective layer 16 may have plural separate regions, as shown in FIGS. 2A and 2B. In this case, any of the regions are not in contact with the transparent electrode layer 14.

The barrier layer 18 formed of Ta, etc., is formed between the reflective layer 16 and the pad electrodes 15, 19. The barrier layer 18 prevents the reflective layer 16 from being dissolved in a photolithographic developer when patterning the reflective layer 16. The barrier layer 18 has the same pattern as the reflective layer 16.

A current blocking layer 17 is formed under the reflective layer 16. The current blocking layer 17 is an insulating layer formed of an insulating material such as $SiO_2$ and is capable of blocking a current to the semiconductor laminate 21 in a region directly below the pad electrode 15. Although light emitted from a region directly below the pad electrode 15 is likely to be absorbed by the pad electrode 15, light emission from such a region is reduced by the current blocking layer 17 and light extraction efficiency of the light-emitting element 1 is thus improved.

In addition, when the current blocking layer 17 is formed of a low-refractive index material such as $SiO_2$ and has a lower refractive index than that of the p-type semiconductor layer 13, light emitted from the light-emitting layer 12 is reflected between the current blocking layer 17 and the p-type semiconductor layer 13. Therefore, light extraction efficiency of the light-emitting element 1 is improved.

The current blocking layer 17 may have a multilayer film structure (DBR structure) formed from alternating layers of low-refractive index films and high-refractive-index films. The low-refractive index films are, e.g., $SiO_2$ films and the high-refractive-index films are transparent films having a higher refractive index than that of the $SiO_2$ films. In this case, the light emitted from the light-emitting layer 12 can be reflected more effectively. Alternatively, a layer having a DBR structure may be formed between the current blocking layer 17 and the reflective layer 16.

As shown in FIGS. 2A and 2B, the current blocking layer 17 has a shape to cover the region directly below the pad electrode 15. Preferably, the current blocking layer 17 has the planar shape which is the same as the pad electrode 15 but is slightly larger than the pad electrode 15.

In addition, the current blocking layer 17 is formed in contact with the transparent electrode layer 14 as well as with the reflective layer 16 such that the transparent electrode layer 14 is separated from the reflective layer 16. Thus, contact between the transparent electrode layer 14 and the reflective layer 16 is prevented.

The current blocking layer 17 must not be formed on the transparent electrode layer 14 so that the current to the region of the semiconductor laminate 21 directly below the pad electrode 15 is blocked. Meanwhile, the reflective layer 16 is formed on the current blocking layer 17 so as not to be in contact with the transparent electrode layer 14. Therefore, the reflective layer 16 is preferably formed inside a hole formed on the transparent electrode layer 14, as shown in FIGS. 1 to 2B. Alternatively, the reflective layer 16 may be formed on the current blocking layer 17 which is embedded in a hole formed on the transparent electrode layer 14. In any cases, the side surface of the current blocking layer 17 is in contact with the transparent electrode layer 14 and the upper surface of the current blocking layer 17 is in contact with the reflective layer 16.

Even in case that the current blocking layer 17 is not provided, it is possible to prevent precipitation of metal indium on the surface of the transparent electrode layer 14 by forming the reflective layer 16 inside a hole of the transparent electrode layer 14 so as to be in contact with the transparent electrode layer 14. However, it is preferable to form the current blocking layer 17 since the above-mentioned effect of improving light extraction efficiency of the light-emitting element 1 is obtained by the current blocking layer 17.

The surface of the light-emitting element 1, except the upper surfaces of the pad electrodes 15 and 19, is covered with a protective film 20 formed of an insulating material such as $SiO_2$.

Effects of the Embodiment

In the embodiment, since the reflective layer 16 and the current blocking layer 17 are provided, the light emitted from the light-emitting layer 12 is prevented from being absorbed by the pad electrode 15. In addition, since the transparent electrode layer 14 is separated from the reflective layer 16 by the current blocking layer 17, it is possible to prevent precipitation of metal indium on the surface of the transparent electrode layer 14, thereby preventing the transparent electrode layer 14 from becoming opaque. As a result, the light-emitting element 1 has high light extraction efficiency.

Although the embodiment of the invention has been described above, the invention is not intended to be limited to the embodiment and the various kinds of modifications can be implemented without departing from the gist of the invention.

In addition, the invention according to claims is not to be limited to the embodiment. Further, all combinations of the features described in the embodiment are not needed to solve the problem of the invention.

What is claimed is:

1. A light-emitting element, comprising:
    a semiconductor laminate comprising a light-emitting layer;
    a transparent electrode layer formed on the semiconductor laminate, the transparent electrode layer comprising an oxide including indium;
    a pad electrode formed on the transparent electrode layer so as to connect to the transparent electrode layer;
    a reflective layer including aluminum, the reflective layer being formed under the pad electrode so as not to contact the transparent electrode layer, and comprising a plurality of separate reflective layer parts; and
    a barrier layer formed on and contacting an uppermost surface of the reflective layer so as not to contact the transparent electrode layer, the pad electrode being formed on and contacting an uppermost surface of the barrier layer, and an outermost sidewall of the barrier layer being aligned in a thickness direction with a sidewall of the reflective layer.

2. The light-emitting element according to claim 1, further comprising an insulating current blocking layer formed between the reflective layer and the semiconductor laminate so as to block a current to the semiconductor laminate in a region directly below the pad electrode.

3. The light-emitting element according to claim 1, wherein the reflective layer is formed inside a hole formed on the transparent electrode layer.

4. The light-emitting element according to claim 1, wherein the reflective layer comprises an Al film.

5. The light-emitting element according to claim 1, wherein the transparent electrode layer comprises one of IZO, $In_2O_3$, ITO and IFO.

6. The light-emitting element according to claim 1, further comprising a substrate,
    wherein the semiconductor laminate further comprises:
        a first conductivity-type semiconductor layer formed on the substrate, the light-emitting layer being formed on the first conductivity-type semiconductor layer; and
        a second conductivity-type semiconductor layer formed on the light-emitting layer.

7. The light-emitting element according to claim 6, wherein the first conductivity-type semiconductor layer, the light-emitting layer and the second conductivity-type semiconductor layer comprise group III nitride compound semiconductor.

8. The light-emitting element according to claim 7, wherein the group III nitride compound semiconductor comprises a quaternary group-III nitride compound semiconductor represented by $Al_xGa_yIn_{1-x-y}N$ ($0<x<1$, $0<y<1$, $0<x+y<1$).

9. The light-emitting element according to claim 6, further comprising:
    a current blocking layer formed on a surface of the second conductivity-type semiconductor layer.

10. A light-emitting element, comprising:
    a semiconductor laminate comprising a light-emitting layer;
    a transparent electrode layer formed on the semiconductor laminate, the transparent electrode layer comprising an oxide including indium;
    a pad electrode formed on the transparent electrode layer so as to connect to the transparent electrode layer;
    a reflective layer including aluminum, the reflective layer being formed under the pad electrode so as not to contact the transparent electrode layer, and comprising a plurality of separate reflective layer parts;
    a substrate, the semiconductor laminate further comprising:
        a first conductivity-type semiconductor layer formed on the substrate, the light-emitting layer being formed on the first conductivity-type semiconductor layer; and
        a second conductivity-type semiconductor layer formed on the light-emitting layer;
    a current blocking layer formed on a surface of the second conductivity-type semiconductor layer, the reflective layer being formed on a surface of the current blocking layer; and
    a barrier layer formed on and contacting an uppermost surface of the reflective layer so as not to contact the transparent electrode layer, the pad electrode being formed on and contacting an uppermost surface of the barrier layer, and an outermost sidewall of the barrier layer being aligned in a thickness direction with a sidewall of the reflective layer.

11. The light-emitting element according to claim 10, further comprising:
    an other current blocking layer formed on a surface of the first conductivity-type semiconductor layer;
    an other reflective layer formed on the other current blocking layer;
    an other barrier layer formed on the other reflective layer; and
    an other pad electrode formed on the other barrier layer.

12. The light-emitting element according to claim 11, further comprising:
    a protective film formed on the transparent electrode layer, a sidewall of the pad electrode, and a sidewall of the other pad electrode, and separating the other pad electrode from the light-emitting layer, the second conductivity-type semiconductor layer and the transparent electrode layer.

13. The light-emitting element according to claim 9, wherein the transparent electrode layer is formed on an outermost portion of the current blocking layer.

14. The light-emitting element according to claim 9, wherein the current blocking layer has an area which is greater than an area of the pad electrode in a plan view, and the pad electrode is surrounded by the current blocking layer in a plan view.

15. The light-emitting element according to claim 9, wherein the current blocking layer has an area which is greater than an area of the reflective film in a plan view, and the reflective film is surrounded by the current blocking layer in a plan view.

16. The light-emitting element according to claim 1, wherein the current blocking layer comprises a line-shaped current blocking layer portion,
 wherein the plurality of separate reflective layer parts comprise a line shape and are formed on the line-shaped current blocking layer portion, and
 wherein the pad electrode comprises a line-shaped pad electrode portion which is formed on the plurality of separate reflective layer parts and on the line-shaped current blocking layer portion.

17. The light-emitting element according to claim 1, further comprising:
 a sapphire substrate, the semiconductor laminate being formed on the sapphire substrate.

18. A light-emitting element comprising:
 a light-emitting layer;
 a transparent electrode thrilled on the light-emitting layer and comprising an oxide including indium;
 a reflective layer which comprises aluminum and is formed on the light-emitting layer and separated from the transparent electrode layer, the reflective layer comprising a plurality of separate reflective layer parts;
 a pad electrode formed on the plurality of separate reflective layer parts and the transparent electrode layer; and
 a barrier layer formed on and contacting an uppermost surface of the reflective layer so as not to contact the transparent electrode layer, the pad electrode being formed on and contacting an uppermost surface of the barrier layer, and an outermost side wall of the barrier layer being aligned in a thickness direction with a sidewall of the reflective layer.

19. The light-emitting element according claim 1, wherein the surface of the reflective layer comprises an upper surface of the reflective layer.

20. The light-emitting element according to claim 1, wherein the barrier layer comprises a metal barrier layer.

21. The light-emitting element according to claim 1, wherein a pattern of the barrier layer is the same as a pattern of the reflective layer.

22. The light-emitting element according to claim 2, wherein the transparent electrode layer comprises a portion formed on the insulating current blocking layer, and
 wherein a thickness of the reflective layer is less than a thickness of the portion of the transparent electrode layer.

23. The light-emitting element according to claim 1, wherein the pad electrode comprises a line-shaped pad electrode, and the plurality separate reflective layer parts comprise a plurality of separate line-shaped reflective layer parts which are aligned lengthwise under the line-shaped pad electrode.

24. The light-emitting element according to claim 1, wherein the barrier layer contacts an entirety of the uppermost surface of the reflective layer, such that the pad electrode is separated from the entirety of the uppermost surface of the reflective layer by the barrier layer.

25. The light-emitting element according to claim 1, wherein the outermost sidewall of the barrier layer and the sidewall of the reflective layer face a sidewall of the transparent electrode layer.

26. The light-emitting element according to claim 25, wherein a width of the pad electrode is greater than a width of the barrier layer, such that the pad electrode is formed between the outermost sidewall of the barrier layer and the sidewall of the transparent electrode layer.

\* \* \* \* \*